United States Patent
Kim et al.

(10) Patent No.: US 10,461,070 B2
(45) Date of Patent: Oct. 29, 2019

(54) DISPLAY APPARATUS

(71) Applicant: Samsung Display Co., Ltd., Yongin-si (KR)

(72) Inventors: Jeonghun Kim, Yongin-si (KR);
Minwoo Byun, Yongin-si (KR);
Byeongguk Jeon, Yongin-si (KR);
Hokyoon Kwon, Yongin-si (KR);
Keunsoo Lee, Yongin-si (KR)

(73) Assignee: Samsung Display Co., Ltd., Yonging-si (KR)

( * ) Notice: Subject to any disclaimer, the term of this patent is extended or adjusted under 35 U.S.C. 154(b) by 0 days.

(21) Appl. No.: 15/865,070

(22) Filed: Jan. 8, 2018

(65) Prior Publication Data

US 2019/0019789 A1    Jan. 17, 2019

(30) Foreign Application Priority Data

Jul. 13, 2017    (KR) .................. 10-2017-0088914

(51) Int. Cl.
*H01L 27/02*    (2006.01)
*H01L 27/32*    (2006.01)

(52) U.S. Cl.
CPC ...... *H01L 27/0248* (2013.01); *H01L 27/0296* (2013.01); *H01L 27/326* (2013.01); *H01L 27/3276* (2013.01)

(58) Field of Classification Search
CPC ............ H01L 27/0296; H01L 27/3276; H01L 27/0248
See application file for complete search history.

(56) References Cited

U.S. PATENT DOCUMENTS

2001/0012084 A1\* 8/2001 Ohta ................ G02F 1/134363
349/141
2007/0080433 A1    4/2007 Lai
(Continued)

FOREIGN PATENT DOCUMENTS

CN    106843389    6/2017
EP     3109727    12/2016
(Continued)

OTHER PUBLICATIONS

European Search Report dated Oct. 25, 2018 in EP Appl. No. 18163392.6 corresponding to U.S. Appl. No. 15/865,070.

*Primary Examiner* — Feifei Yeung Lopez
(74) *Attorney, Agent, or Firm* — H.C. Park & Associates, PLC

(57) ABSTRACT

Provided is a display apparatus having improved display quality by reducing defects due to static electricity. The display apparatus includes: a substrate including a display area and a peripheral area surrounding the display area, the display area including a main area and a first protruding area and a second protruding area extending from the main area and protruding toward the peripheral area in a first direction, the second protruding area being spaced apart from the first protruding area in a second direction that intersects the first direction, a groove portion is disposed between the first protruding area and the second protruding area; a display unit including a first light emitter and a second light emitter; a first load matching part electrically connected to the first light emitter; and a second load matching part electrically connected to the second light emitter.

19 Claims, 7 Drawing Sheets

(56) References Cited

U.S. PATENT DOCUMENTS

| | | | |
|---|---|---|---|
| 2008/0088568 A1 | 4/2008 | Haga et al. | |
| 2016/0378334 A1 | 12/2016 | Liu et al. | |
| 2017/0047347 A1 | 2/2017 | Kim et al. | |
| 2017/0337876 A1* | 11/2017 | Kim | G09G 3/3225 |
| 2018/0090061 A1 | 3/2018 | Kim et al. | |
| 2018/0129106 A1* | 5/2018 | Gao | G02F 1/134363 |
| 2018/0196475 A1 | 7/2018 | Bao et al. | |

FOREIGN PATENT DOCUMENTS

| | | |
|---|---|---|
| EP | 3300067 | 3/2018 |
| EP | 3346363 | 11/2018 |
| JP | 2006-278008 | 10/2006 |
| JP | 2014-191922 | 10/2014 |
| KR | 10-2010-0022438 | 3/2010 |

* cited by examiner

DISPLAY APPARATUS

CROSS-REFERENCE TO RELATED APPLICATION

This application claims priority from and the benefit of Korean Patent Application No. 10-2017-0088914, filed on Jul. 13, 2017, which is hereby incorporated by reference for all purposes as if fully set forth herein.

BACKGROUND

Field

Exemplary embodiments relate to a display apparatus. More particularly, exemplary embodiments relate to a display apparatus having improved display quality by reducing defects due to static electricity.

Discussion of the Background

Among display apparatuses, organic light-emitting display apparatuses have been spotlighted as next-generation display apparatuses because of their wide viewing angles, high contrast ratios, and fast response times.

In general, an organic light-emitting display apparatus includes a thin-film transistor (TFT) and organic light-emitting devices formed on a substrate, where the organic light-emitting devices emit light by themselves. Such an organic light-emitting display apparatus is generally applied to a small product such as a mobile phone or a large product such as a television.

Such an organic light-emitting display apparatus includes a display unit including an organic light-emitting device. The display unit includes the organic light-emitting device and displays an image when the organic light-emitting device emits light by itself. Rather than just a conventional rectangular shape, different applications require that the display unit have different shapes according to fit a particular application.

A display apparatus including a display unit having non-rectangular shape have problems in that a portion of the display unit is vulnerable to static electricity due to a structural difference between flat edge display and non-flat edge. The static electricity may damage a pixel causing the display to failing to display a high quality image.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus having improved display quality by reducing defects due to static electricity.

Additional aspects will be set forth in the detailed description which follows, and, in part, will be apparent from the disclosure, or may be learned by practice of the inventive concept.

According to one or more exemplary embodiments, a display apparatus includes: a substrate including a display area and a peripheral area surrounding the display area, the display area including a main area located at a center of the substrate, a first protruding area extending from the main area and protruding toward the peripheral area in a first direction and second protruding area extending from the main area and protruding toward the peripheral area in the first direction, the second protruding area being spaced apart from the first protruding area in a second direction that intersects the first direction, and a groove portion is disposed between the first protruding area and the second protruding area; a display unit including a first light emitter disposed on the first protruding area and a second light emitter disposed on the second protruding area; a first load matching part disposed on a portion of the peripheral area adjacent to the first light emitter and electrically connected to the first light emitter; and a second load matching part disposed on a portion of the peripheral area adjacent to the second light emitter and electrically connected to the second light emitter.

According to one or more exemplary embodiments, a display apparatus includes: a substrate including a display area and a peripheral area surrounding the display area, the display area including a main area located at a center of the substrate and a first protruding area extending from the main area and protruding toward the peripheral area in a first direction, a second protruding area extending from the main area and protruding toward the peripheral area in the first direction, and a groove portion is disposed between the first protruding area and the second protruding area; a display unit including a first light emitter disposed on a first portion of the first protruding area, a second light emitter disposed on a first portion of the second protruding area, a third light emitter disposed on a second portion of the first protruding area, and a fourth light emitter disposed on a second portion of the second protruding area; a first load matching part disposed on a portion of the peripheral area adjacent to the first light emitter and electrically connected to the first light emitter; a second load matching part disposed on a portion of the peripheral area adjacent to the second light emitter and electrically connected to the second light emitter; and a third load matching part disposed on a portion of the peripheral area between the third light emitter and the fourth light emitter and electrically connected to the third light emitter and the fourth light emitter.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
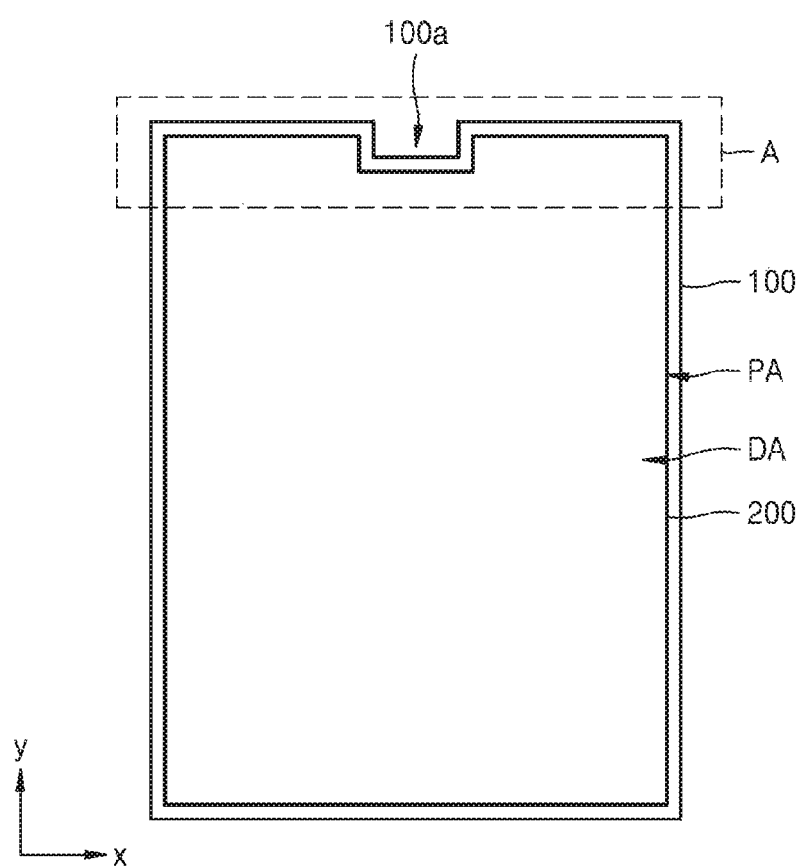
FIG. 1 is a plan view of a display apparatus according to an embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
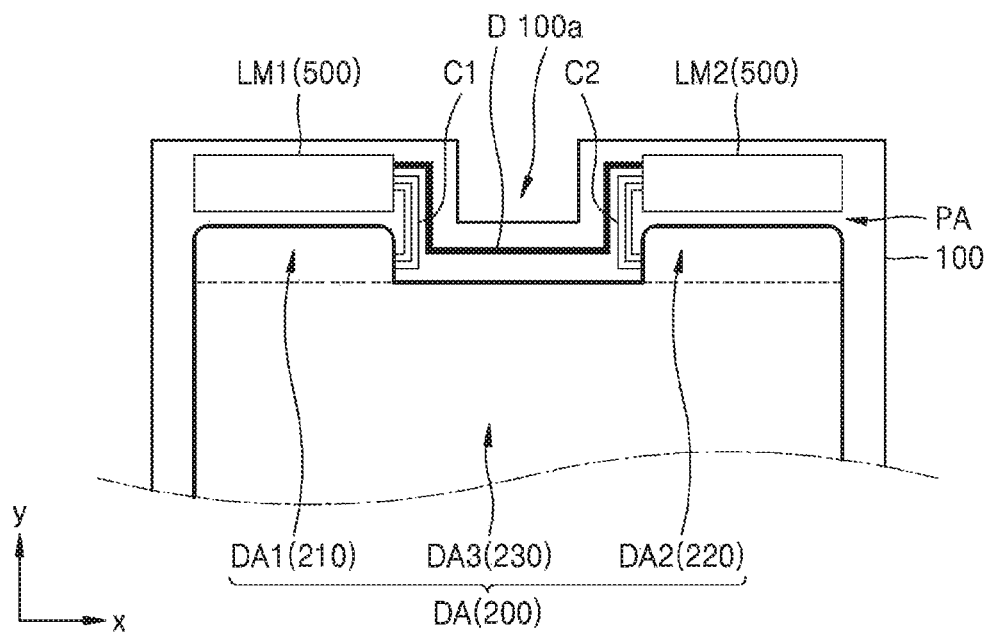
FIG. 2 is an enlarged plan view illustrating a portion A of the display apparatus of FIG. 1.

FIG. 1 is a plan view of a display apparatus according to an embodiment. FIG. 2 is an enlarged plan view illustrating a portion A of the display apparatus of FIG. 1.

Referring to FIG. 1, the display apparatus according to the present embodiment includes a substrate 100 including a display area DA and a peripheral area PA located outside the display area DA. The peripheral area PA may surround the display area DA, and may be a non-emitting area where a display unit 200 is not located as described below.

The display area DA may include a main area DA3 located at the center of the substrate 100, and a first protruding area DA1 and a second protruding area DA2 extending from the main area DA3. In an exemplary embodiment, the main area DA3 may have, but is not limited to, a quadrangular shape. The first protruding area DA1 and the second protruding area DA2 may protrude from the display area DA toward the peripheral area PA in a first direction (e.g., a +y direction). That is, the first protruding area DA1 and the second protruding area DA2 may protrude in the same direction, and may be areas obtained when parts of one side of the main area DA3 extend. As shown in FIG. 2, the first protruding area DA1 and the second protruding area DA2 may be spaced apart from each other in a second direction (e.g., a +x direction) that intersects the first direction (e.g., the +y direction).

A groove portion 100a may be formed in a part of the substrate 100. The groove portion 100a may be located between the first protruding area DA1 and the second protruding area DA2 of the display area DA. Although not shown, the display apparatus according to the present embodiment may further include a camera module and/or a speaker module located in the groove portion 100a.

Referring to FIG. 2, the display apparatus according to an embodiment may include the display unit 200 located on the display area DA, and a first load matching part LM1 and a second load matching part LM2 located on the peripheral area PA of the substrate 100.

The display unit 200 may be located on the display area DA, and may include a first light emitter 210 located on the first protruding area DA1 of the display area DA, a second light emitter 220 located on the second protruding area DA2 of the display area DA, and a third light emitter 230 located on the main area DA3 of the display area DA. In this case, the first light emitter 210, the second light emitter 220, and the third light emitter 230 are conceptually distinguished according to positions for convenience of explanation, and may be actually integrated, instead of separate light emitters. In the present embodiment, the first light emitter 210 and the second light emitter 220 may be located at a side of the third light emitter 230 having a quadrangular shape and located on the main area DA3.

The first load matching part LM1 and the second load matching part LM2 may be located on the peripheral area PA of the substrate 100. The first load matching part LM1 may be located on a portion of the peripheral area PA adjacent to the first light emitter 210, and the second load matching part LM2 may be located on a portion of the peripheral area PA adjacent to the second light emitter 220. That is, the first load matching part LM1 may be located on a portion of the peripheral area PA adjacent to the first light emitter 210 and may be electrically connected to the first light emitter 210 through a first wiring C1. Also, the second load matching part LM2 may be located on a portion of the peripheral area PA adjacent to the second light emitter 220 and may be electrically connected to the second light emitter 220 through a second wiring C2.

In a conventional display apparatus including the display unit 200 having a simple rectangular shape, the number of pixels per line may be the same and a load applied to each line is the same. However, in the display apparatus according to an exemplary embodiment, the third light emitter 230 located on the main area DA3 may have a rectangular shape and thus a load applied to each line is the same, like in the conventional display apparatus, whereas a light emitter is not located between the first protruding area DA1 and the second protruding area DA2, and thus, loads applied to the first light emitter 210 and the second light emitter 220 may not be the same.

Accordingly, in the display apparatus according to an exemplary embodiment, the first load matching part LM1 and the second load matching part LM2 may be located on portions of the peripheral area PA adjacent to the first light emitter 210 and the second light emitter 220, to be electrically connected to first light emitter 210 and the second light emitter 220, and may match loads applied to lines.

In an exemplary embodiment, the first load matching part LM1 and the second load matching part LM2 may be electrically connected to each other. The first load matching part LM1 and the second load matching part LM2 may be electrically connected to each other through a conductive film D. For example, in an exemplary embodiment, the conductive film D for connecting the first load matching part LM1 and the second load matching part LM2 may include, but is not limited to, a material that is the same as that of a third conductive layer 515 as described below. As such, since the first load matching part LM1 and the second load matching part LM2 may be electrically connected, an equipotential region may be increased when static electricity is introduced, thereby preventing damage to the display area DA due to the static electricity.

Figure 3:
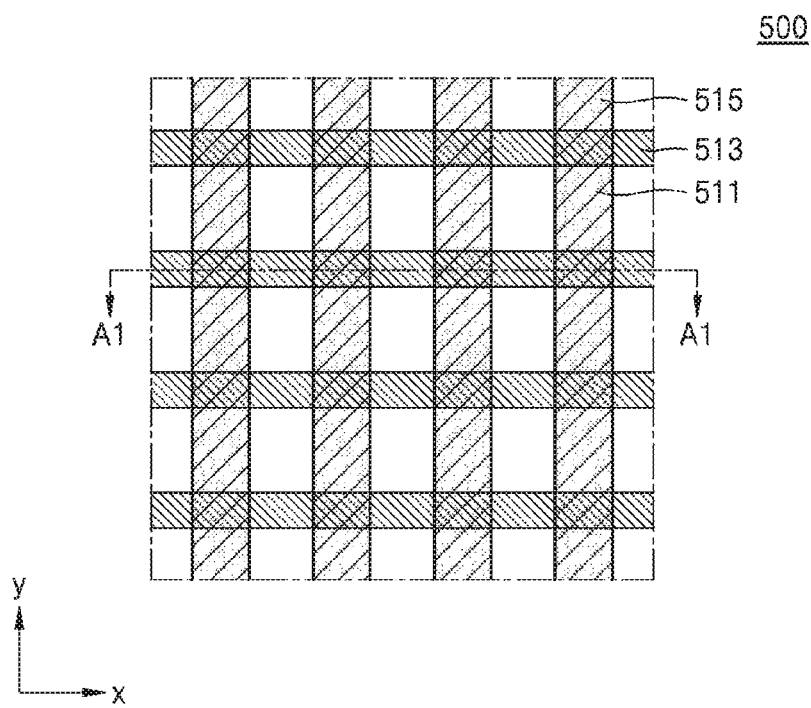
FIG. 3 is a plan view illustrating a part of the display apparatus of FIG. 1.
Figure 4:
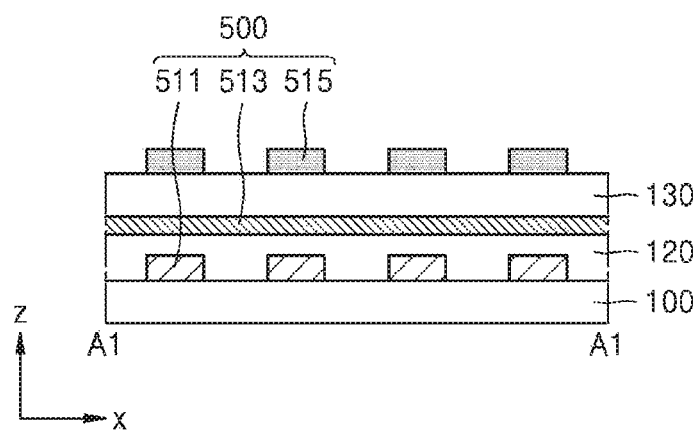
FIG. 4 is a cross-sectional view taken along a line A1-A1 of the display apparatus of FIG. 3.

FIG. 3 is a plan view illustrating a part of the display apparatus of FIG. 1. FIG. 4 is a cross-sectional view taken along a line A1-A1 of the display apparatus of FIG. 3. FIGS. 3 and 4 are enlarged views illustrating a structure of the first load matching part LM1 of FIG. 2. A structure of the second load matching part LM2 of FIG. 2 is the same as the structure of the first load matching part LM1, and thus a repeated explanation will not be given.

Referring to FIGS. 3 and 4, a first load matching part 500 may include a first conductive layer 511, a second conductive layer 513 located on the first conductive layer 511, and a third conductive layer 515 located on the second conductive layer 513. In the present embodiment, the third conductive layer 515 may extend by being patterned in the first direction (e.g., the +y direction) or the second direction (e.g., the +x direction) that intersects the first direction (e.g., the +y direction). Referring to FIG. 3, the first conductive layer 511 may extend in the first direction (e.g., the +y direction), and the second conductive layer 513 may extend in the second direction (e.g., the +x direction) that intersects first direction (e.g., the +y direction). That is, the first conductive layer 511 and the second conductive layer 513 may be arranged to be perpendicular to each other in a lattice form.

The third conductive layer 515 may be located on the second conductive layer 513. As shown in FIG. 3, the third conductive layer 515 may extend in the first direction (e.g., the +y direction), like the first conductive layer 511, to overlap the first conductive layer 511. In the present embodiment, the third conductive layer 515 may be patterned in one direction, like the first conductive layer 511. Although the third conductive layer 515 is patterned in the first direction (e.g., the +y direction), like the first conductive layer 511, in FIG. 3, the present disclosure is not limited thereto and, in other embodiments, the third conductive layer 515 may be patterned in the second direction (e.g., the +x direction), like the second conductive layer 513.

Referring to FIG. 2, as described above, the first load matching part LM1 may be located on a portion of the peripheral area PA adjacent to the first light emitter 210 and may be electrically connected to the first light emitter 210 through the first wiring C1, and the second load matching part LM2 may be located on a portion of the peripheral area PA adjacent to the second light emitter 220 and may be electrically connected to the second light emitter 220 through the second wiring C2. In an exemplary embodiment, the first wiring C1 and the second wiring C2 may include, but are not limited to, a material that is the same as that of the second conductive layer 513.

Also, as described above, the first load matching part LM1 and the second load matching part LM2 may be electrically connected to each other through the conductive film D. In an embodiment, the conductive film D may include, but is not limited to, a material that is the same as that of the third conductive layer 515.

Referring to FIG. 4, the first conductive layer 511 may be located on the substrate 100, and the second conductive layer 513 may be located on the first conductive layer 511. Although the first conductive layer 511 may be directly located on the substrate 100 in FIG. 4, an insulating layer or a buffer layer may be further located between the substrate 100 and the first conductive layer 511. A first insulating film 120 may be located between the first conductive layer 511 and the second conductive layer 513. The first insulating film 120 may be a gate insulating film as described below. The third conductive layer 515 may be located on the second conductive layer 513. A second insulating film 130 may be located between the second conductive layer 513 and the third conductive layer 515. The second insulating film 130 may be an interlayer insulating film as described below. Although not shown, the first conductive layer 511 and the third conductive layer 515 may be electrically connected to each other through a contact hole.

When the third conductive layer 515 is not divided through patterning, that is, when the third conductive layer 515 is formed as a common electrode, the amount of charge may proportionally increases as the area of the third conductive layer 515 increases. In this case, when static electricity is introduced into the third conductive layer 515, and then is introduced into the first light emitter 210 of the display unit 200 that is electrically connected to the third conductive layer 515, the static electricity may lead to damage to pixels of the first light emitter 210 and defects of the display area DA.

However, in the display apparatus according to an embodiment, since a charge area of the third conductive layer 515 is reduced by using a patterning structure of the third conductive layer 515, the amount of charge may be reduced and a structure able to reduce statistic electricity may be realized.

Figure 5:
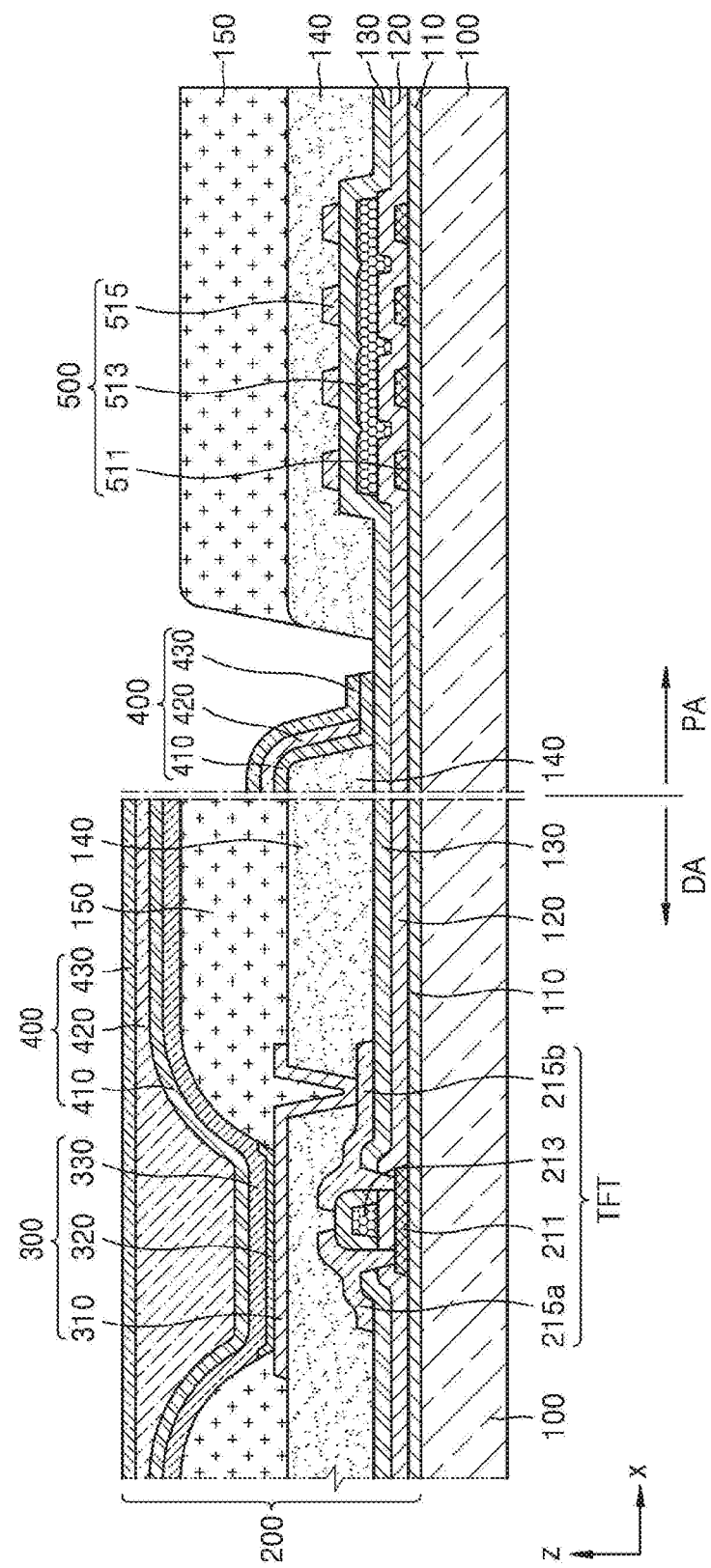
FIG. 5 is a cross-sectional view illustrating a part of the display apparatus of FIG. 1.

FIG. 5 is a cross-sectional view illustrating a part of the display apparatus of FIG. 1.

Referring to FIG. 5, the substrate 100 of the display apparatus according to an exemplary embodiment includes the display area DA and the peripheral area PA located outside the display area DA. The substrate 100 may include any of various flexible or bendable material, for example, a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

A display device 300 and a thin-film transistor (TFT) to which the display device 300 is electrically connected may be located on the display area DA of the substrate 100 as shown in FIG. 5. In FIG. 2, an organic light-emitting device is located as the display device 300 on the display area DA. When the organic light-emitting device is electrically connected to the TFT, it may mean that a pixel electrode 310 is electrically connected to the TFT. If necessary, a TFT (not shown) may also be located on the peripheral area PA outside the display area DA of the substrate 100. The TFT located on the peripheral area PA may be, for example, a part of a circuit unit for controlling an electrical signal applied to the display area DA.

The TFT may include an active pattern 211, a gate electrode 213, a source electrode 215a, and a drain electrode 215b, each including amorphous silicon, polycrystalline silicon, or an organic semiconductor material. In order to ensure insulation between the active pattern 211 and the gate electrode 213, the first insulating film 120 (hereinafter, referred to the gate insulating film) including an inorganic material such as silicon oxide, silicon nitride, and/or silicon oxynitride may be located between the active pattern 211 and the gate electrode 213. In addition, the second insulating film 130 (hereinafter, referred to as the interlayer insulating film) including an inorganic material such as silicon oxide, silicon nitride, and/or silicon oxynitride may be located on the gate electrode 213, and the source electrode 215a and the drain electrode 215b may be located on the interlayer insulating film 130. Such an insulating film including an inorganic material may be formed by using chemical vapor deposition (CVD) or atomic layer deposition (ALD), which may apply to the following embodiments and modifications thereof.

A buffer layer 110 including an inorganic material such as silicon oxide, silicon nitride, and/or silicon oxynitride may be located between the TFT and the substrate 100. The buffer layer 110 may improve the flatness of a top surface of the substrate 100 or may prevent or minimize penetration of impurities into the active pattern 211 of the TFT.

A planarization layer 140 may be located on the TFT. For example, when the organic light-emitting device is located on the TFT as shown in FIG. 5, the planarization layer 140 may planarize a protective film that covers the TFT. The planarization layer 140 may be formed of an organic material such as benzocyclobutene (BCB) or hexamethyldisiloxane (HMDSO). Although the planarization layer 140 has a single-layer structure in FIG. 2, various modifications may be made, for example, the planarization layer 140 may have a multi-layer structure.

The organic light-emitting device including the pixel electrode 310, a counter electrode 330, and an intermediate layer 320 including an emission layer located between the pixel electrode 310 and the counter electrode 330 may be located on the planarization layer 140 within the display area DA of the substrate 100. The pixel electrode 310 may be electrically connected to the TFT by contacting any one of the source electrode 215a and the drain electrode 215b through an opening formed in the planarization layer 140 or the like as shown in FIG. 5.

A pixel-defining film 150 may be located on the planarization layer 140. The pixel-defining film 150 defines a pixel by having an opening corresponding to each of sub-pixels, that is, an opening through which at least a central portion of the pixel electrode 310 is exposed. Also, in FIG. 5, the pixel-defining film 150 prevents an arc or the like from occurring at an edge of the pixel electrode 310 by increasing a distance between the edge of the pixel electrode 310 and the counter electrode 330 located on the pixel electrode 310. The pixel-defining film 150 may be formed of an organic material such as polyimide or HMDSO.

The intermediate layer 320 of the organic light-emitting device may include a low-molecular weight material or a high-molecular weight material. When the intermediate layer 320 includes a low-molecular weight material, the intermediate layer 320 may have a single-layer structure or a multi-layer structure in which a hole injection layer (HIL), a hole transport layer (HTL), an emission layer (EML), an electron transport layer (ETL), and an electron injection layer (EIL) are stacked, and may include any of various organic materials including copper phthalocyanine (CuPc), N,N'-Di(naphthalene-1-yl)-N,N'-diphenyl-benzidine (NPB), and tris-8-hydroxyquinoline aluminum (Alq3). The above layers may be formed by using vacuum deposition.

When the intermediate layer 320 includes a high-molecular weight material, the intermediate layer 320 may have a structure including an HTL and an EML. In this case, the HTL may include poly(3,4-ethylenedioxythiophene) (PEDOT), and the EML may include a polymer material such as poly-phenylenevinylene (PPV)-based material or polyfluorene-based material. The intermediate layer 320 may be formed by using screen printing, inkjet printing, or laser-induced thermal imaging (LITI).

However, the intermediate layer 320 is not limited thereto, and may have any of various other structures. The intermediate layer 320 may include one layer over a plurality of the pixel electrodes 310, or may include layers patterned to correspond to the plurality of pixel electrodes 310.

The counter electrode 330 may be located on the display area DA, to cover the display area DA as shown in FIG. 5. That is, the counter electrode 330 may be integrally formed with a plurality of the organic light-emitting devices and may correspond to the plurality of pixel electrodes 310.

Since the organic light-emitting device may be easily damaged by external moisture or oxygen, an encapsulation layer 400 may cover and protect the organic light-emitting device. The encapsulation layer 400 may cover the display area DA and may extend beyond the display area DA. The encapsulation layer 400 may include a first inorganic encapsulation layer 410, an organic encapsulation layer 420, and a second inorganic encapsulation layer 430 as shown in FIG. 5.

The first inorganic encapsulation layer 410 may cover the counter electrode 330, and may include silicon oxide, silicon nitride, and/or silicon oxynitride. If necessary, other layers such as a capping layer may be located between the first inorganic encapsulation layer 410 and the counter electrode 330. Since the first inorganic encapsulation layer 410 may be formed along a lower structure, a top surface of the first inorganic encapsulation layer 410 may not be flat, as shown in FIG. 5. The organic encapsulation layer 420 may cover the first inorganic encapsulation layer 410, and may have a substantially flat top surface, unlike the first inorganic encapsulation layer 410. In detail, a top surface of a portion of the organic encapsulation layer 420 on the display area DA may be substantially flat. The organic encapsulation layer 420 may include at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420, and may include silicon oxide, silicon nitride, and/or silicon oxynitride. The second inorganic encapsulation layer 430 may prevent the organic encapsulation layer 420 from being exposed to the outside by contacting the first inorganic encapsulation layer 410 at an edge outside the display area DA.

Since the encapsulation layer 400 may include the first inorganic encapsulation layer 410, the organic encapsulation layer 420, and the second inorganic encapsulation layer 430, even when cracks occur in the encapsulation layer 400 through such a multi-layer structure, the cracks may not be connected between the first inorganic encapsulation layer 410 and the organic encapsulation layer 420, or between the organic encapsulation layer 420 and the second inorganic encapsulation layer 430. Accordingly, the possibility that a path through which external moisture or oxygen is penetrated into the display area DA is formed may be prevented or minimized.

Although not shown, a polarization plate (not shown) may be located on the encapsulation layer 400 by using an optically clear adhesive (OCA). The polarization plate may reduce reflection of external light. For example, when external light that passes through the polarization plate is reflected by a top surface of the counter electrode 330, and then passes again through the polarization plate, a phase of the external light may be changed as the external light passes through the polarization plate twice. As a result, a phase of the reflected light may be different from a phase of the external light introduced into the polarization plate to generate destructive interference, thereby reducing reflection of the external light and improving visibility. The OCA and the polarization plate may cover the opening of the planarization layer 140 as shown in FIG. 5. However, the display apparatus according to an exemplary embodiment may not include the polarization plate, and the polarization plate may be omitted while other elements may be used. For example, reflection of external light may be reduced by omitting the polarization plate and using a black matrix and a color filter.

When the display area DA is the first protruding area DA1, the display unit 200 located on the display area DA may be the first light emitter 210. In this case, the first load matching part LM1 (see FIG. 2) may be located on a portion of the peripheral area PA adjacent to the first light emitter 210. In another exemplary embodiment, when the display area DA is the second protruding area DA2, the display unit 200 located on the display area DA may be the second light emitter 220. In this case, the second load matching part LM2 (see FIG. 2) may be located on a portion of the peripheral area PA adjacent to the second light emitter 220.

The first load matching part 500 located on the peripheral area PA may include the first conductive layer 511, the second conductive layer 513, and the third conductive layer 515 as described above. In the present embodiment, the first conductive layer 511 may be located on the buffer layer 110, and may include a material that is the same as that of the active pattern 211 of the TFT. The second conductive layer 513 may be located on the first conductive layer 511, and may include a material that is the same as that of the gate electrode 213 of the TFT. The gate insulating film 120 may extend to be located between the first conductive layer 511 and the second conductive layer 513. The third conductive layer 515 may be located on the second conductive layer 513, and may include a material that is the same as that of the source electrode 215a or the drain electrode 215b of the TFT. The interlayer insulating film 130 may extend to be located between the second conductive layer 513 and the third conductive layer 515. An insulating layer may be located on the third conductive layer 515. The planarization layer 140 and the pixel-defining film 150 may extend to be located on the third conductive layer 515.

Referring to FIG. 2, as described above, the first load matching part 500 may be located on a portion of the peripheral area PA adjacent to the first light emitter 210 and may be electrically connected to the first light emitter 210 through the first wiring C1, and the second load matching part LM2 may be located on a portion of the peripheral area PA adjacent to the second light emitter 220 and may be electrically connected to the second light emitter 220 through the second wiring C2. In an exemplary embodiment, the first wiring C1 and the second wiring C2 may include, but are not limited to, a material that is the same as that of the gate electrode 213.

Also, as described above, the first load matching part 500 and the second load matching part LM2 may be electrically connected to each other through a conductive layer. In an exemplary embodiment, the conductive layer may include, but is not limited to, a material that is the same as that of the source electrode 215a or the drain electrode 215b.

Figure 6:
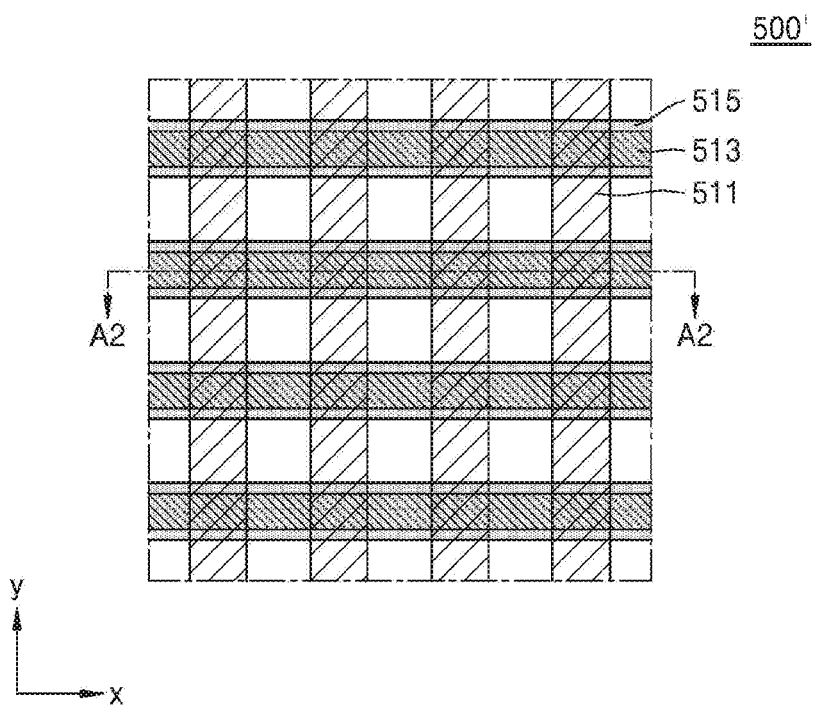
FIG. 6 is a plan view illustrating a part of a display apparatus according to another embodiment.
Figure 7:
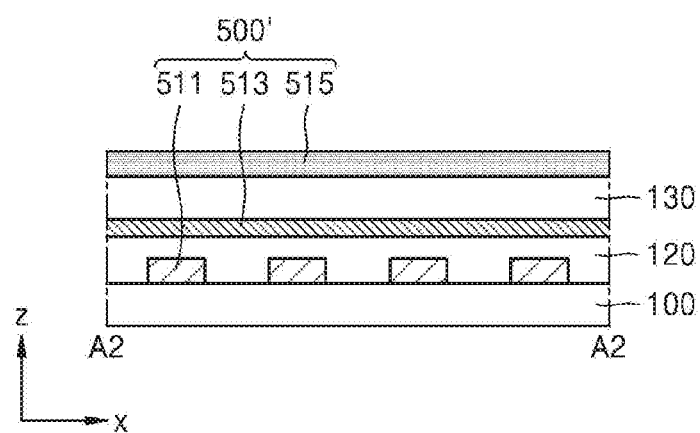
FIG. 7 is a cross-sectional view taken along a line A2-A2 of the display apparatus of FIG. 6.

FIG. 6 is a plan view illustrating a part of a display apparatus according to another embodiment. FIG. 7 is a cross-sectional view taken along a line A2-A2 of the display apparatus of FIG. 6. The display apparatus of FIGS. 6 and 7 is different from the display apparatus of FIGS. 3 and 4 with respect to a pattern of the third conductive layer 515 of a first load matching part 500'. Other elements are the same and thus a repeated explanation will not be given.

Referring to FIGS. 6 and 7, the first load matching part 500' may include the first conductive layer 511, the second conductive layer 513 located on the first conductive layer 511, and the third conductive layer 515 located on the second conductive layer 513. In the present embodiment, the first conductive layer 511 may extend in the first direction (e.g., the +y direction), and the second conductive layer 513 may extend in the second direction (e.g., the +x direction) that is perpendicular to the first direction (e.g., the +y direction). That is, the first conductive layer 511 and the second conductive layer 513 may be arranged to be perpendicular to each other in a lattice form, like in the above embodiment.

The third conductive layer 515 may be located on the second conductive layer 513. As shown in FIG. 6, the third conductive layer 515 may extend in the second direction (e.g., the +x direction), like the first conductive layer 511. In this case, the third conductive layer 515 may overlap the second conductive layer 513. That is, in the present embodiment, the third conductive layer 515 may be patterned in the second direction (e.g., the +x direction), like the second conductive layer 513.

Referring to FIG. 7, the first conductive layer 511 may be located on the substrate 100, and the second conductive layer 513 may be located on the first conductive layer 511. Although the first conductive layer 511 may be directly located on the substrate 10 in FIG. 7, an insulating layer or a buffer layer may be further located between the substrate 100 and the first conductive layer 511. The gate insulating film 120 may be located between the first conductive layer 511 and the second conductive layer 513. The third conductive layer 515 may be located on the second conductive layer 513. The interlayer insulating film 130 may be located between the second conductive layer 513 and the third conductive layer 515. Although not shown, the first conductive layer 511 and the third conductive layer 515 may be electrically connected to each other through a contact hole.

When the third conductive layer 515 is not divided through patterning, that is, when the third conductive layer 515 is formed as a common electrode, the amount of charge proportionally increases as the area of the third conductive layer 515 increases. In this case, when static electricity is introduced into the third conductive layer 515 and then is introduced into the first light emitter 210 of the display unit 200 that is electrically connected to the third conductive layer 515, the static electricity may lead to damage to pixels of the first light emitter 210 and defects of the display area DA.

However, in the display apparatus according to an exemplary embodiment, since a charge area of the third conductive layer 515 may be reduced by using a patterning structure of the third conductive layer 515, the amount of charge may be reduced and a structure strong against static electricity may be realized.

Figure 8:
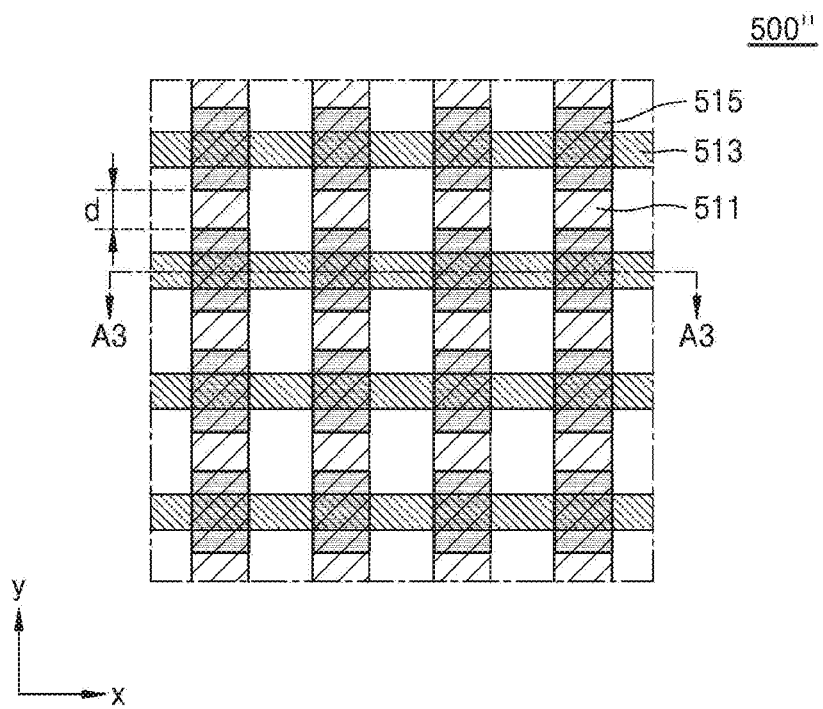
FIG. 8 is a plan view illustrating a part of a display apparatus according to another embodiment.
Figure 9:
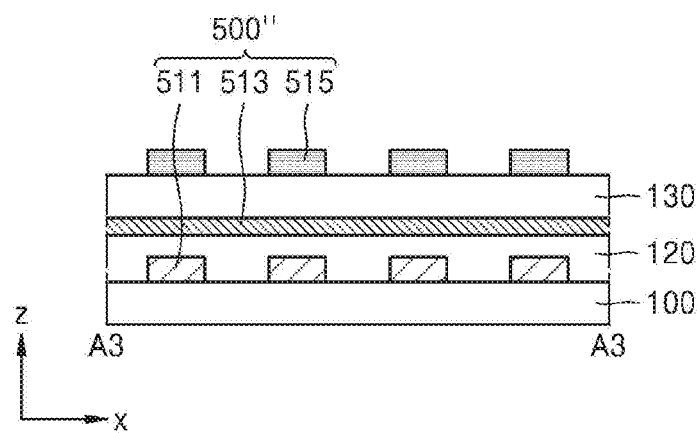
FIG. 9 is a cross-sectional view taken along a line A3-A3 of the display apparatus of FIG. 8.

FIG. 8 is a plan view illustrating a part of a display apparatus according to another embodiment. FIG. 9 is a cross-sectional view taken along a line A3-A3 of the display apparatus of FIG. 8. The display apparatus of FIGS. 8 and 9 is different from the display apparatuses in the above embodiments in a shape of a first load matching part 500" and other elements are the same, and thus a repeated explanation will not be given.

Referring to FIGS. 8 and 9, like in the above embodiments, the first load matching part 500" may include the first conductive layer 511, the second conductive layer 513, and the third conductive layer 515. In the display apparatus according the present embodiment, the third conductive layer 515 may be patterned into an island shape, instead of a linear shape. The third conductive layers 515 may be arranged in the first direction (e.g., the +y direction) to be spaced apart by a predetermined interval 'd' from each other. Even in this case, in order to form a cap, the third conductive layer 515 may overlap an overlapping portion between the first conductive layer 511 and the second conductive layer 513.

In the present embodiment, the area of the third conductive layer 515 may be less than that in the above embodiments. Since the amount of charge may be reduced by reducing a charge area, damage to the display unit 200 due to static electricity introduced through the load matching part may be prevented.

Also, although the third conductive layer 515 is patterned into an island shape on an overlapping portion between the first conductive layer 511 and the second conductive layer 513 in the present exemplary embodiment, the present disclosure is not limited thereto and a pattern shape of the third conductive layer 515 may be any of various other shapes. According to the present disclosure, since static electricity may be reduced by reducing a charge area by patterning and dividing the third conductive layer 515 having a large area, a pattern shape of the third conductive layer 515 may not be limited to a specific shape.

Figure 10:
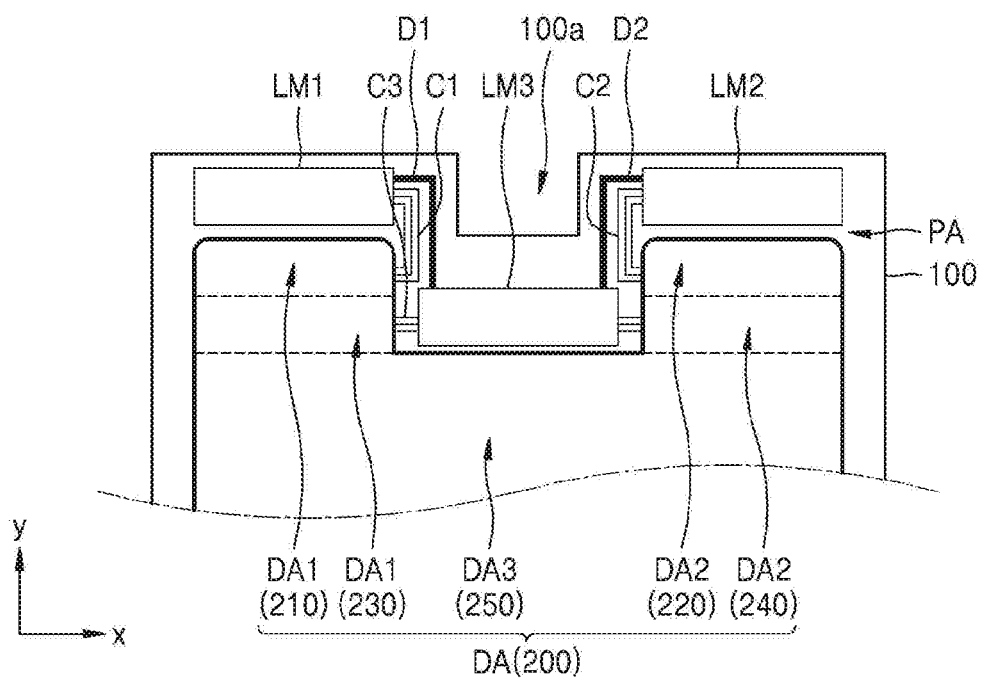
FIG. 10 is a plan view illustrating a part of a display apparatus according to another embodiment.
Figure 11:
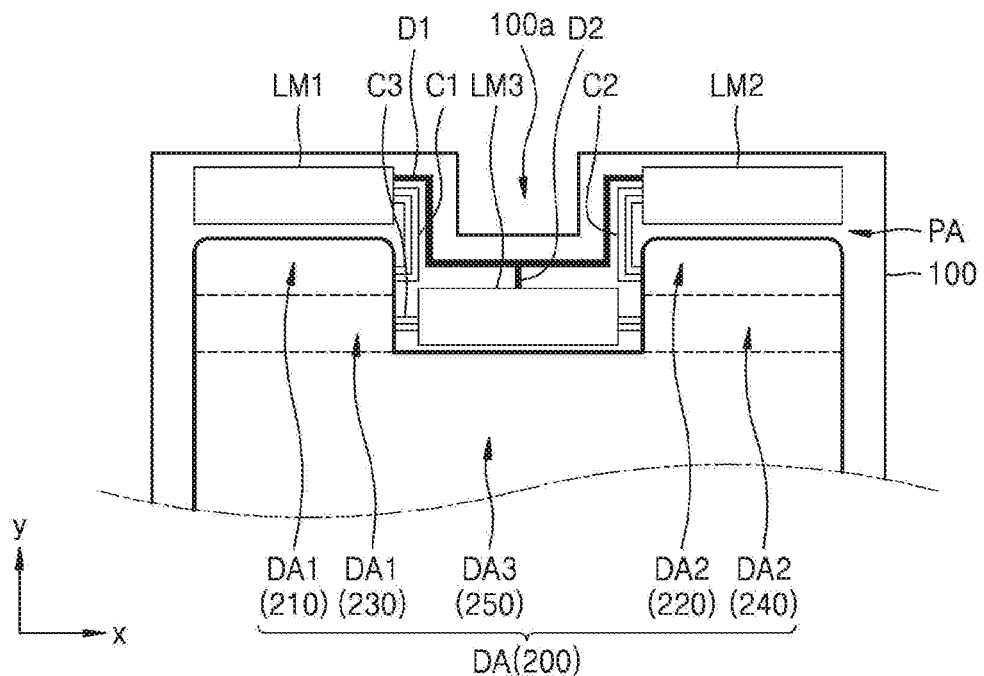
FIG. 11 is a plan view illustrating a part of the display apparatus according to another embodiment.

FIG. 10 is a plan view illustrating a part of a display apparatus according to another embodiment. FIG. 11 is a plan view illustrating a part of a display apparatus according to another embodiment.

The display apparatus according to the present embodiment may be similar to that in any of the above embodiments, and may further include a third load matching part LM3. Accordingly, structures of the first load matching part LM1, the second load matching part LM2, and the third load matching part LM3 may be the same as those in the above embodiments. That is, each load matching part may include the first conductive layer 511, the second conductive layer 513, and the third conductive layer 515 that is patterned. A repeated explanation of a detailed structure of each load matching part will not be given and the following will focus on a difference including the third load matching part LM3.

Referring to FIG. 10, the display apparatus according to an exemplary embodiment includes the substrate 100 including the display area DA and the peripheral area PA located outside the display area DA. The peripheral area PA may surround the display area DA, and may be a non-emitting area where the display unit 200 is not located. In the present embodiment, the display area DA may be the same as that in the above embodiments. That is, the display area DA may include the main area DA3 located at the center of the substrate 100, and the first protruding area DA1 and the second protruding area DA2 extending from the main area DA3. As shown in FIG. 10, the first protruding area DA1 and the second protruding area DA2 may be arranged in the second direction (e.g., the +x direction) that intersects the first direction (e.g., the +y direction), and be spaced apart by a predetermined interval from each other.

The groove portion 100a may be formed in a part of the substrate 100. The groove portion 100a may be located between the first protruding area DA1 and the second protruding area DA2 of the display area DA. Although not shown, the display apparatus according to an exemplary embodiment may further include a camera and/or a speaker located in the groove portion 100a.

Referring to FIG. 10, the display apparatus according to an exemplary embodiment may include the display unit 200 located on the display area DA of the substrate 100, and the first load matching part LM1, the second load matching part LM2, and the third load matching part LM3 located on the peripheral area PA.

The display unit 200 may be located on the display area DA, and may include the first light emitter 210 and the third light emitter 230 located on the first protruding area DA1 of the display area DA, the second light emitter 220 and a fourth light emitter 240 located on the second protruding area DA2 of the display area DA, and a fifth light emitter 250 located on the main area DA3 of the display area DA. In this case, the first light emitter 210 through the fifth light emitter 250 are conceptually distinguished according to positions for convenience of explanation, but are actually integrated, instead of separate, light emitters. That is, the first light emitter 210 may be located on a first portion of the first protruding area DA1, and the third light emitter 230 may be located on a second portion of the first protruding area DA1. Also, the second light emitter 220 may be located on a first portion of the second protruding area DA2, and the fourth light emitter 240 may be located on a second portion of the second protruding area DA2.

There is a difference between the present embodiment and the above embodiments in that an emission area in the first protruding area DA1 or the second protruding area DA2 may be divided and is connected to a separate load matching part. That is, a light emitter in the first protruding area DA1 may be electrically connected to the first load matching part LM1 and another light emitter in the first protruding area DA1 may be electrically connected to the third load matching part LM3.

The first load matching part LM1 and the second load matching part LM2 may be located on the peripheral area PA of the substrate 100. The first load matching part LM1 may be located on a portion of the peripheral area PA adjacent to the first light emitter 210, the second load matching part LM2 may be located on a portion of the peripheral area PA adjacent to the second light emitter 220, and the third load matching part LM3 may be located on a portion of the peripheral area PA adjacent to the third light emitter 230 and the fourth light emitter 240. Although the third load matching part LM3 may be located between the first protruding area DA1 and the second protruding area DA2, that is, between the third light emitter 230 and the fourth light emitter 240 in FIG. 10, the present disclosure is not limited thereto.

In detail, the first load matching part LM1 may be located on a portion of the peripheral area PA adjacent to the first light emitter 210, and may be electrically connected to the first light emitter 210 through the first wiring C1. The second load matching part LM2 may be located on a portion of the peripheral area PA adjacent to the second light emitter 220 and may be electrically connected to the second light emitter 220 through the second wiring C2. The third load matching part LM3 may be located on a portion of the peripheral area PA adjacent to the third light emitter 230 and the fourth light emitter 240 and may be electrically connected to the third light emitter 230 and the fourth light emitter 240 through a third wiring C3. The first wiring C1 through the third wiring C3 may include, but are not limited to, a material that is the same as that of the second conductive layer 513 of each of the load matching parts LM1, LM2, and LM3.

In the display apparatus of an exemplary embodiment, the first load matching part LM1 through the third load matching part LM3 may be electrically connected to each other. The first load matching part LM1 through the third load matching part LM3 may be electrically connected to each other through conductive films D1 and D2. For example, in the present embodiment, a first conductive film for connecting the first load matching part LM1 and the third load matching part LM3, and a second conductive film for connecting the second load matching part LM2 and the third load matching part LM3, may include a material that is the same as that of the third conductive layer 515. As such, as the first load matching part LM1 through the third load matching part LM3 are electrically connected to each other, an equipotential region may be increased when static electricity is introduced, thereby preventing damage to the display area DA due to the static electricity.

In a conventional display apparatus including the display unit 200 having a simple rectangular shape, the number of pixels per line is the same and a load applied to each line is the same. In the display apparatus according to an exemplary embodiment, the fifth light emitter 250 located on the main area DA3 has a rectangular shape and thus a load applied to each line is the same, like in the conventional display apparatus, however, the pixels are not located between the first protruding area DA1 and the second protruding area DA2 and thus loads applied to the first light emitter 210 through the fourth light emitter 240 are not the same.

Accordingly, in the display apparatus according to an exemplary embodiment, the first load matching part LM1, the second load matching part LM2, and the third load matching part LM3 may be located on portions of the peripheral area PA adjacent to the first light emitter 210 through the fourth light emitter 240 to be electrically connected to the first light emitter 210 through the fourth light emitter 240 and may match loads applied to lines.

The display apparatus of FIG. 11 is the same as the display apparatus of FIG. 10 except an arrangement of a first conductive film and a second conductive film for connecting the first load matching part LM1 through the third load matching part LM3. That is, in FIG. 10, the first load matching part LM1 and the third load matching part LM3 are electrically connected by the first conductive film and the second load matching part LM2 and the third load matching part LM3 are electrically connected by the second conductive film. In the present exemplary embodiment, the first load matching part LM1 and the second load matching part LM2 are electrically connected by the first conductive film and the second conductive film may electrically connect the first conductive film and the third load matching part LM3. Other elements and configurations are the same as those in the above embodiments and a repeated explanation thereof will not be given.

As described above, according to an embodiment, a display apparatus having improved display quality may be provided by reducing defects due to static electricity. The scope of the present disclosure is not limited by such effects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
   a substrate comprising a display area and a peripheral area surrounding the display area, the display area comprising:
      a main area located at a center of the substrate;
      a first protruding area extending from the main area and protruding toward the peripheral area in a first direction;

a second protruding area extending from the main area and protruding toward the peripheral area in the first direction, the second protruding area being spaced apart from the first protruding area in a second direction that intersects the first direction; and a groove portion disposed between the first protruding area and the second protruding area;

a display unit comprising a first light emitter disposed on the first protruding area and a second light emitter disposed on the second protruding area;

a first load matching part disposed on a portion of the peripheral area adjacent to the first light emitter and electrically connected to the first light emitter; and a second load matching part disposed on a portion of the peripheral area adjacent to the second light emitter and electrically connected to the second light emitter, wherein the first load matching part and the second load matching part are electrically connected to each other by a conductive film disposed on the peripheral area.

2. The display apparatus of claim 1, wherein each of the first load matching part and the second load matching part comprises a first conductive layer disposed on the substrate, a second conductive layer disposed on the first conductive layer, and a third conductive layer disposed on the second conductive layer, wherein the third conductive layer is patterned in the first direction or the second direction.

3. The display apparatus of claim 2, wherein the third conductive layer is patterned so that at least a part of the third conductive layer overlaps the second conductive layer.

4. The display apparatus of claim 2, wherein:
the first conductive layer extends in the first direction, and
the second conductive layer extends in the second direction.

5. The display apparatus of claim 2, wherein the first conductive layer and the third conductive layer are electrically connected to each other through a contact hole.

6. The display apparatus of claim 2, further comprising a thin-film transistor disposed on the display area, and the thin-film transistor comprising:
an active pattern,
a gate electrode disposed on the active pattern and comprising at least a part overlapping the active pattern, and
a source electrode or a drain electrode disposed on the gate electrode and electrically connected to the active pattern,
wherein the first conductive layer comprises a material that is the same as a material of the active pattern, the second conductive layer comprises a material that is the same as a material of the gate electrode, and the third conductive layer comprises a material that is the same as a material of the source electrode or the drain electrode.

7. The display apparatus of claim 2, wherein:
the first light emitter and the first load matching part are electrically connected to each other by a first wiring,
the second light emitter and the second load matching part are electrically connected to each other by a second wiring, and
the first wiring and the second wiring comprise a material that is the same as a material of the second conductive layer.

8. The display apparatus of claim 2, wherein the conductive film comprises a material that is the same as a material of the third conductive layer.

9. The display apparatus of claim 1, further comprising a third light emitter disposed on the main area, wherein the first light emitter, the second light emitter, and the third light emitter are integrated with each other.

10. A display apparatus, comprising:
a substrate comprising a display area and a peripheral area surrounding the display area, the display area comprising:
a main area located at a center of the substrate;
a first protruding area extending from the main area and protruding toward the peripheral area in a first direction;
a second protruding area extending from the main area and protruding toward the peripheral area in the first direction; and
a groove portion disposed between the first protruding area and the second protruding area;
a display unit comprising a first light emitter disposed on a first portion of the first protruding area, a second light emitter disposed on a first portion of the second protruding area, a third light emitter disposed on a second portion of the first protruding area, and a fourth light emitter disposed on a second portion of the second protruding area;
a first load matching part disposed on a portion of the peripheral area adjacent to the first light emitter and electrically connected to the first light emitter;
a second load matching part disposed on a portion of the peripheral area adjacent to the second light emitter and electrically connected to the second light emitter; and
a third load matching part disposed on a portion of the peripheral area between the third light emitter and the fourth light emitter and electrically connected to the third light emitter and the fourth light emitter.

11. The display apparatus of claim 10, wherein each of the first load matching part, the second load matching part, and the third load matching part comprises a first conductive layer disposed on the substrate, a second conductive layer disposed on the first conductive layer, and a third conductive layer disposed on the second conductive layer, and the third conductive layer is patterned in the first direction or a second direction that intersects the first direction.

12. The display apparatus of claim 11, wherein the third conductive layer is patterned so that at least a part of the third conductive layer overlaps the second conductive layer.

13. The display apparatus of claim 11, wherein the first conductive layer extends in the first direction and the second conductive layer extends in the second direction.

14. The display apparatus of claim 11, wherein the first conductive layer and the third conductive layer are electrically connected to each other through a contact hole.

15. The display apparatus of claim 11, further comprising a thin-film transistor disposed on the display area, and the thin-film transistor comprising:
an active pattern,
a gate electrode disposed on the active pattern and comprising at least a part overlapping the active pattern, and
a source electrode or a drain electrode disposed on the gate electrode and electrically connected to the active pattern,
wherein the first conductive layer comprises a material that is the same as a material of the active pattern, the second conductive layer comprises a material that is the same as a material of the gate electrode, and the third conductive layer comprises a material that is the same as a material of the source electrode or the drain electrode.

16. The display apparatus of claim 11, wherein the first light emitter and the first load matching part are electrically connected to each other by a first wiring, the second light emitter and the second load matching part are electrically connected to each other by a second wiring, and the third light emitter and the fourth light emitter and the third load matching part are electrically connected to each other by a third wiring, wherein the first wiring, the second wiring, and the third wiring comprise a material that is the same as a material of the second conductive layer.

17. The display apparatus of claim 11, wherein the first load matching part, the second load matching part, and the third load matching part are electrically connected to each other.

18. The display apparatus of claim 17, wherein the first load matching part, the second load matching part, and the third load matching part are electrically connected by a conductive film comprising a material that is the same as a material of the third conductive layer.

19. The display apparatus of claim 10, further comprising a fifth light emitter disposed on the main area, wherein the first light emitter, the second light emitter, the third light emitter, the fourth light emitter, and the fifth light emitter are integrated with each other.

* * * * *